United States Patent
Li et al.

(10) Patent No.: US 7,928,784 B2
(45) Date of Patent: Apr. 19, 2011

(54) METHOD AND APPARATUS TO IMPROVE AND CONTROL THE PROPAGATION DELAY IN A CURRENT SLEWING CIRCUIT

(75) Inventors: Huijuan Li, Plano, TX (US); Abidur Rahman, Allen, TX (US); Chienyu Huang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 47 days.

(21) Appl. No.: 12/492,252

(22) Filed: Jun. 26, 2009

(65) Prior Publication Data

US 2010/0327928 A1  Dec. 30, 2010

(51) Int. Cl.
*H03K 5/12* (2006.01)

(52) U.S. Cl. ......................... 327/170; 327/261

(58) Field of Classification Search .................. None
See application file for complete search history.

(56) References Cited

U.S. PATENT DOCUMENTS

| | | | |
|---|---|---|---|
| 5,999,353 A * | 12/1999 | Hase et al. | 360/51 |
| 6,538,394 B2 * | 3/2003 | Volk et al. | 315/291 |
| 7,250,810 B1 | 7/2007 | Tsen | |
| 7,298,173 B1 | 11/2007 | Jiang et al. | |
| 7,474,141 B2 | 1/2009 | Huang et al. | |
| 7,679,420 B1 * | 3/2010 | Burkland et al. | 327/333 |

* cited by examiner

*Primary Examiner* — Cassandra Cox
(74) *Attorney, Agent, or Firm* — John J. Patti; Wade J. Brady, III; Frederick J. Telecky, Jr.

(57) ABSTRACT

A circuit for independently controlling slew and propagation delay of a current DAC is provided. The circuit applies dual slope technique with feed-back control the gate (or control electrode) of a switching transistor to make propagation delay independent control from rise/fall slew rate. This allows one to adjust propagation delay and current slew rate separately to achieve better performance.

16 Claims, 3 Drawing Sheets

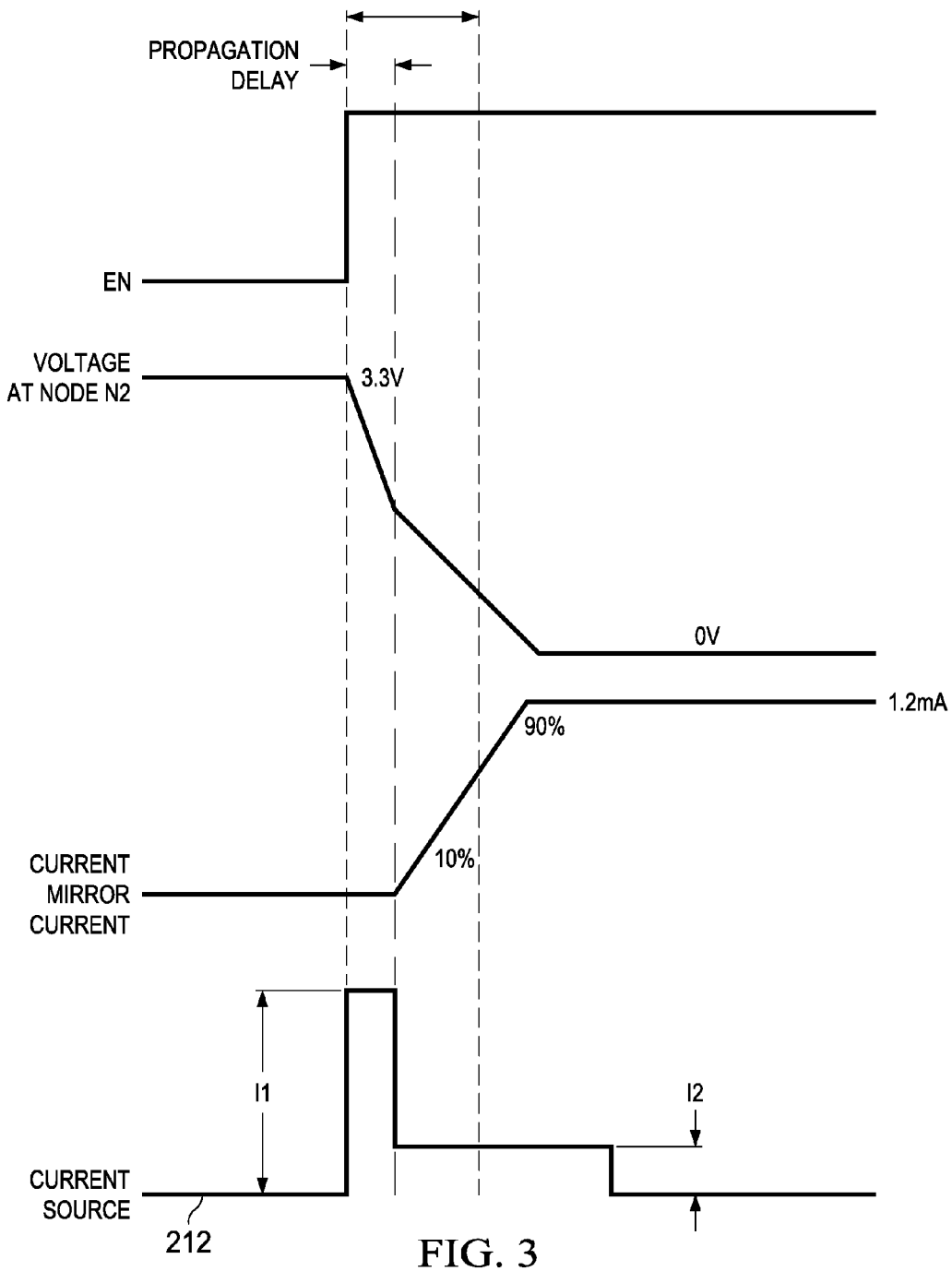

METHOD AND APPARATUS TO IMPROVE AND CONTROL THE PROPAGATION DELAY IN A CURRENT SLEWING CIRCUIT

TECHNICAL FIELD

The invention relates generally to slewing circuitry and, more particularly, to slewing circuit to control the ramping of a light emitting diode (LED) output current.

BACKGROUND

Slew control is generally important in various circuits, such as LED output stages. In many applications, though, programmability of the rise and fall times is missing, which may not allow many circuits to meet desired specification. The timing diagram for such a current slew control circuit can be seen in FIG. 1. As shown, there is a particular ramp time for the gate voltage of a switching transistor (from about 3.3V to about 0V). Part of this ramp time is used for current slewing while the other part (between the rising edge of the enable signal EN and the trigger voltage level to activate the current mirror) is the "turn-on" delay of the current mirror. The problem is propagation delay time is very closely related to the rise/fall time. If the parameters are designed to achieve desired proper rise/fall time, propagation delay can be significantly long and cannot meet the performance requirements.

Some examples of conventional circuits are: U.S. Pat. Nos. 7,250,810; 7,298,173; and 7,474,141.

SUMMARY

A preferred embodiment of the present invention, accordingly, provides an apparatus. The apparatus comprises a current mirror; a reference current source that is coupled to the current mirror; a switching transistor having a first passive electrode, a second passive electrode, and a control electrode, wherein the first passive electrode is coupled to the reference current source; a resistor that is coupled to the second passive electrode of the switching transistor; a capacitor that is coupled to the control electrode of the switching transistor; and a current steering inverter that is coupled to the control electrode of the switching transistor and the reference current source, wherein the current steering inverter receives an enable signal so as to actuate and deactuate the switching transistor, and wherein the current steering inverter adjusts a current applied to the capacitor between one of a first current level for a predetermined propagation delay for activation of the current mirror and a second current level for a predetermined slew rate of the current mirror.

In accordance with a preferred embodiment of the present invention, the current steering inverter further comprises: a first current sensing circuit that is coupled to the reference current source; a second current sensing circuit that is coupled to the control electrode of the switching transistor; a pair of transistors coupled in series with one another, wherein the control electrode of each transistor receives the enable signal; a first adjustable current source that is coupled to one of the transistors from the pair of transistors, wherein the first adjustable current source is controlled by the second current sensing circuit; and a second adjustable current source that is coupled to one of the transistors from the pair of transistors, wherein the second adjustable current source is controlled by the first current sensing circuit.

In accordance with a preferred embodiment of the present invention, the switching transistor is an NMOS transistor.

In accordance with a preferred embodiment of the present invention, the apparatus further comprises a cascode transistor that is coupled between the reference current source and the current mirror.

In accordance with a preferred embodiment of the present invention, the apparatus further comprises a plurality of light emitting diodes (LEDs).

In accordance with a preferred embodiment of the present invention, the first level is five times higher than the second level.

In accordance with a preferred embodiment of the present invention, an apparatus is provided. The apparatus comprises a first voltage rail; a second voltage rail; a reference current source that is coupled to the first voltage rail; a cascode PMOS transistor that is coupled to the reference current source at its source; a current mirror including: a sourcing NMOS transistor that is diode-connected, that is coupled to the drain of the first PMOS transistor at its drain, and that is coupled to the second voltage rail at its source; and a plurality of mirroring NMOS transistors, wherein the gate of each mirror NMOS transistor is coupled to the gate of the sourcing NMOS transistor, and wherein the source of each mirror NMOS transistor is coupled to the second voltage rail; a switching NMOS transistor that is coupled to the reference current source at its drain; a resistor that is coupled between the source of the switching NMOS transistor and the second voltage rail; a capacitor that is coupled between the gate of the switching NMOS transistor and the second voltage rail; and a current steering inverter that is coupled to the gate of the switching NMOS transistor and the reference current source, wherein the current steering inverter receives an enable signal so as to actuate and deactuate the switching transistor, and wherein the current steering inverter adjusts a current applied to the capacitor between one of a first current level for a predetermined propagation delay for activation of the current mirror and a second current level for a predetermined slew rate of the current mirror.

In accordance with a preferred embodiment of the present invention, the current steering inverter further comprises: a first current sensing circuit that is coupled to the reference current source; a second current sensing circuit that is coupled to the gate of the switching NMOS transistor; a PMOS transistor, wherein the gate of the PMOS transistor receives the enable signal; an NMOS transistor that is coupled to the drain of the PMOS transistor at its drain and the gate of the PMOS transistor at its gate; a first adjustable current source that is coupled between the first voltage rail and the source of the PMOS transistor, wherein the first adjustable current source is controlled by the second current sensing circuit; and a second adjustable current source that is coupled between the second voltage rail and the source of the NMOS transistor, wherein the second adjustable current source is controlled by the first current sensing circuit.

In accordance with a preferred embodiment of the present invention, a method is provided. The method comprises receiving an edge of a signal; applying a first current level from an adjustable current source to a capacitor that is coupled to the control electrode of a switching transistor after receipt of the edge; detecting a voltage transition when the current is flowing into one of a current mirror and the switching transistor while the first current level is being applied to the transistor; and adjusting the current of the adjustable current source from the first current level to a second current level when the voltage transition has been detected to decrease the rate of change of charge applied to the capacitor.

In accordance with a preferred embodiment of the present invention, the step of receiving further comprises receiving a rising edge.

In accordance with a preferred embodiment of the present invention, the step of detecting further comprises detecting the voltage transition when the current is flowing into a current mirror.

In accordance with a preferred embodiment of the present invention, the step of adjusting further comprises decreasing the current of the adjustable current source from the first current level to the second current level to discharge the capacitor more slowly.

In accordance with a preferred embodiment of the present invention, the step of receiving further comprises receiving a falling edge.

In accordance with a preferred embodiment of the present invention, the step of detecting further comprising detecting the voltage transition when the current is flowing into the switching transistor.

In accordance with a preferred embodiment of the present invention, the step of adjusting further comprises decreasing the current of the adjustable current source to charge the capacitor more slowly.

In accordance with a preferred embodiment of the present invention, a method is provided.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is an example of a timing diagram for the circuit of FIG. 2.

DETAILED DESCRIPTION

Figure 1:
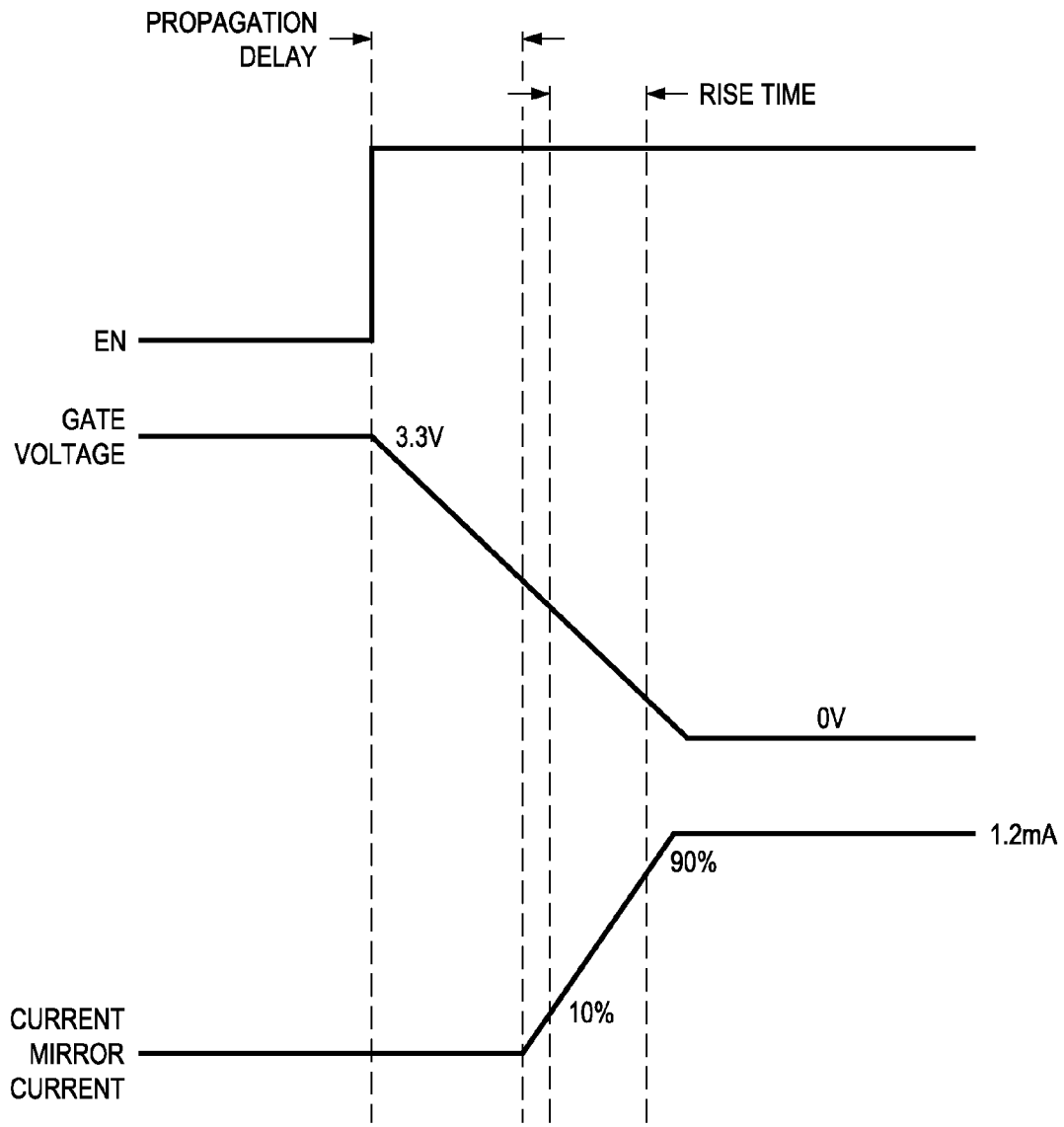
FIG. 1 is an example of a timing diagram for a circuit having a significant propagation delay.

Refer now to the drawings wherein depicted elements are, for the sake of clarity, not necessarily shown to scale and wherein like or similar elements are designated by the same reference numeral through the several views.

Figure 2:
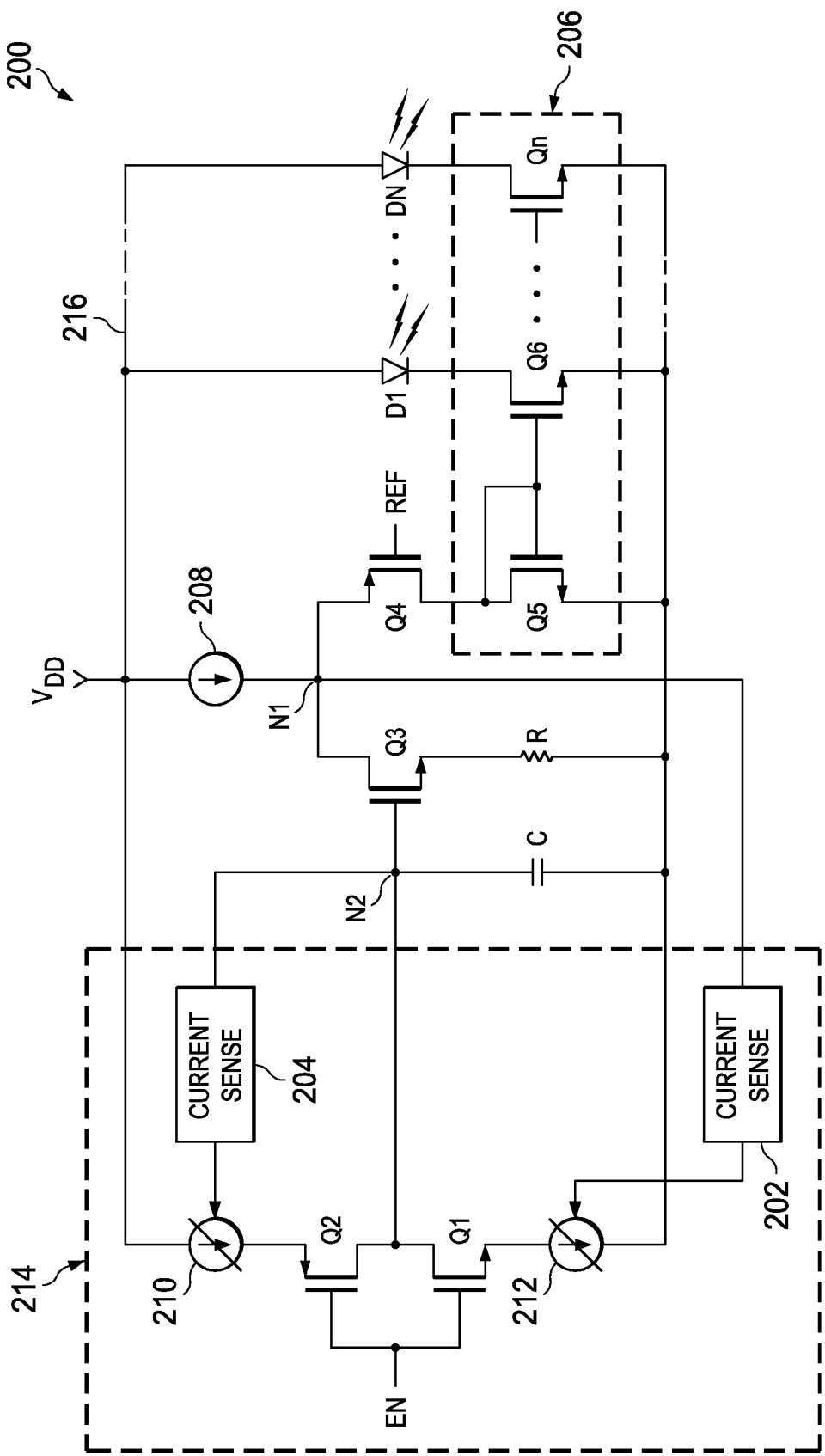
FIG. 2 is an example of a circuit in accordance with a preferred embodiment of the present invention.

Referring to FIG. 2 of the drawings, the reference numeral 200 generally designates an example of a circuit in accordance with a preferred embodiment of the present invention. Circuit 200 generally comprises a current mirror 206, LEDs D1 through DN, reference current source 208, transistors Q3 and Q4 (which are preferably NMOS and PMOS transistors, respectively), resistor R, capacitor C, and current steering inverter 214. Inverter 214 generally comprises transistors Q1 and Q2 (which are preferably NMOS and PMOS transistors, respectively), current sense circuit 202 and 204, and adjustable current sources 210 and 212. Additionally, current mirror 206 generally comprises transistors Q5 to Qn (which are preferably NMOS transistors).

In operation, which can be seen in FIG. 3, the current steering inverter 214 adjusts currents to change the voltage on node N2 and actuates/deactuates transistor Q3. Initially, current sources 212 and/or 210 are set to first current levels I1 to set a predetermined propagation delay. When the enable signal EN (which is supplied to the gates or control electrodes of transistors Q1 and Q2) is toggled, voltage at the control electrode or gate of transistor Q3 (node N2) will begin to vary because of the charging or discharging of capacitor C by current sources 212 and/or 210. Discharging or charging is continued with the high, first current level I1, until current sense circuits 202 and/or 204 detect a voltage transition (at nodes N2 and/or N1). The length of the propagation delay can be varied based on the height of the first current level I1, where the shortest propagation delay occurs when the current sources 212 and/or 210 are allowed to rail.

On a rising edge of enable signal EN, sense circuit 202 detects the voltage transition on node N1, which indicates that current is flowing in current mirror 206. When current is flowing into the current mirror 206, output currents at LEDs D1 through DN are about to begin slewing. Generally, when current begins to flow in the current mirror 206, there is an increase in the voltage at node N1, which is preferably between the voltage drop across resistor R (generally about 500 mV) and the sum of the bias voltage REF applied to cascode transistor Q4 and a threshold voltage (generally about 2.1V). Current sense circuit 202 compares the voltage at node N1 to one half of the voltage applied to voltage rail 216 or VDD/2 (which is preferably derived from a voltage divider coupled to rail 216 to generally ensure that current sense circuit 202 is not sensitive to voltage supply changes). Once this determination is made, the sink current for current sources 212 is readjusted or lowered to a second level I2 (which is preferably about one-fifth of the first current level), and the current through current mirror 206 increases to its desired level (about 1.2 mA). Additionally, the slew rate of current mirror 206 can be adjusted based on the second current level I2, where the slew rate of current mirror 206 decreases proportionally with the height of the second current level I2.

On a falling edge of the enable signal EN, sense circuit 204 detects the voltage transition on node N2, which indicates that current is flowing through switching transistor Q3. Preferably, a determination is made by sensing circuit 204 as to whether the voltage at node N2 is greater than a threshold voltage. Once the current sensing circuit 204 detects that the voltage on node N2 is greater than the threshold voltage, the sourced current for current source 210 is readjusted or lowered to the second current level I2 (which is preferably about one-fifth of the first current level), and the current through current mirror decreases from its desired level to about 0 A.

Outside of the slew control, circuit 200 is generally designed to provide current for LEDs, operating as a current digital-to-analog converter (DAC). In particular, when circuit 200 is "on," sourcing transistor Q5 (which is diode-connected) has a current that is mirrored by mirroring transistors Q6 to Qn. Each of these mirroring transistors Q6 to Qn is coupled to LEDs D1 to DN, respectively, so that the mirrored current can activate LEDs D1 to DN.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a current mirror;
    a reference current source that is coupled to the current mirror;
    a switching transistor having a first passive electrode, a second passive electrode, and a control electrode, wherein the first passive electrode is coupled to the reference current source;
    a resistor that is coupled to the second passive electrode of the switching transistor;
    a capacitor that is coupled to the control electrode of the switching transistor; and
    a current steering inverter that is coupled to the control electrode of the switching transistor and the reference current source, wherein the current steering inverter receives an enable signal so as to actuate and deactuate the switching transistor, and wherein the current steering inverter adjusts a current applied to the capacitor between one of a first current level for a predetermined propagation delay for activation of the current mirror and a second current level for a predetermined slew rate of the current mirror.

2. The apparatus of claim 1, wherein the current steering inverter further comprises:
    a first current sensing circuit that is coupled to the reference current source;
    a second current sensing circuit that is coupled to the control electrode of the switching transistor;
    a pair of transistors coupled in series with one another, wherein the control electrode of each transistor receives the enable signal;
    a first adjustable current source that is coupled to one of the transistors from the pair of transistors, wherein the first adjustable current source is controlled by the second current sensing circuit; and
    a second adjustable current source that is coupled to one of the transistors from the pair of transistors, wherein the second adjustable current source is controlled by the first current sensing circuit.

3. The apparatus of claim 1, wherein the switching transistor is an NMOS transistor.

4. The apparatus of claim 1, wherein the apparatus further comprises a cascode transistor that is coupled between the reference current source and the current mirror.

5. The apparatus of claim 1, wherein the apparatus further comprises a plurality of light emitting diodes (LEDs), wherein each LED is coupled to the current mirror.

6. The apparatus of claim 1, wherein the first level is five times higher than the second level.

7. An apparatus comprising:
    a first voltage rail;
    a second voltage rail;
    a reference current source that is coupled to the first voltage rail;
    a cascode PMOS transistor that is coupled to the reference current source at its source;
    a current mirror including:
        a sourcing NMOS transistor that is diode-connected, that is coupled to the drain of the cascode PMOS transistor at its drain, and that is coupled to the second voltage rail at its source; and
        a plurality of mirroring NMOS transistors, wherein the gate of each mirror NMOS transistor is coupled to the gate of the sourcing NMOS transistor, and wherein the source of each mirror NMOS transistor is coupled to the second voltage rail;
    a switching NMOS transistor that is coupled to the reference current source at its drain;
    a resistor that is coupled between the source of the switching NMOS transistor and the second voltage rail;
    a capacitor that is coupled between the gate of the switching NMOS transistor and the second voltage rail; and
    a current steering inverter that is coupled to the gate of the switching NMOS transistor and the reference current source, wherein the current steering inverter receives an enable signal so as to actuate and deactuate the switching transistor, and wherein the current steering inverter adjusts a current applied to the capacitor between one of a first current level for a predetermined propagation delay for activation of the current mirror and a second current level for a predetermined slew rate of the current mirror.

8. The apparatus of claim 7, wherein the current steering inverter further comprises:
    a first current sensing circuit that is coupled to the reference current source;
    a second current sensing circuit that is coupled to the gate of the switching NMOS transistor;
    a PMOS transistor, wherein the gate of the PMOS transistor receives the enable signal;
    an NMOS transistor that is coupled to the drain of the PMOS transistor at its drain and the gate of the PMOS transistor at its gate;
    a first adjustable current source that is coupled between the first voltage rail and the source of the PMOS transistor, wherein the first adjustable current source is controlled by the second current sensing circuit; and
    a second adjustable current source that is coupled between the second voltage rail and the source of the NMOS transistor, wherein the second adjustable current source is controlled by the first current sensing circuit.

9. The apparatus of claim 7, wherein the first level is five times higher than the second level.

10. A method comprising:
    receiving an edge of a signal;
    applying a first current level from an adjustable current source to a capacitor that is coupled to the control electrode of a switching transistor after receipt of the edge;
    detecting a voltage transition when the current is flowing into one of a current mirror and the switching transistor while the first current level is being applied to the transistor; and
    adjusting the current of the adjustable current source from the first current level to a second current level when the voltage transition has been detected to decrease the rate of change of charge applied to the capacitor.

11. The method of claim 10, wherein the step of receiving further comprises receiving a rising edge.

12. The method claim 11, wherein the step of detecting further comprises detecting the voltage transition when the current is flowing into a current mirror.

13. The method of claim 12, wherein the step of adjusting further comprises decreasing the current of the adjustable current source from the first current level to the second current level to discharge the capacitor more slowly.

14. The method of claim 10, wherein the step of receiving further comprises receiving a falling edge.

15. The method of claim 14, wherein the step of detecting further comprising detecting the voltage transition when the current is flowing into the switching transistor.

16. The method of claim 15, wherein the step of adjusting further comprises decreasing the current of the adjustable current source to charge the capacitor more slowly.

* * * * *